United States Patent [19]

Campbell

[11] 4,334,646
[45] Jun. 15, 1982

[54] METHOD OF SOLDER REFLOW ASSEMBLY

[75] Inventor: Henry J. Campbell, Melbourne Beach, Fla.

[73] Assignee: Harris Corporation, Melbourne, Fla.

[21] Appl. No.: 141,100

[22] Filed: Apr. 17, 1980

[51] Int. Cl.³ .................. B23K 1/12; B23K 1/02; H01L 21/60
[52] U.S. Cl. .................. 228/180 A; 228/191; 228/200; 228/242; 228/258
[58] Field of Search .................. 228/180 A, 191, 242, 228/40, 6 A, 258, 180 R, 200

[56] References Cited

U.S. PATENT DOCUMENTS

| | | | |
|---|---|---|---|
| 3,054,174 | 9/1962 | Rose et al. | 228/180 X |
| 3,214,827 | 11/1965 | Phohofsky | 228/258 X |
| 3,977,075 | 8/1976 | Lynch et al. | 228/242 X |
| 4,022,371 | 5/1977 | Skarvinko et al. | 228/242 X |
| 4,032,033 | 6/1977 | Chu et al. | 228/200 |

FOREIGN PATENT DOCUMENTS 584991  1/1978  U.S.S.R. .................. 228/242

OTHER PUBLICATIONS

Spigarelli, D. J., "Vapor Phase Solder Reflow for Hybrid Circuit Manufacture", Solid State Technology, 10/1976, pp. 50–53.
Magdo, S., "Solder Reflow Face-Up Chip Mounting", IBM Technical Disclosure Bulletin, vol. 19, No. 4, p. 1217, 9/1976.

*Primary Examiner*—Gus T. Hampilos
*Attorney, Agent, or Firm*—Leitner, Palan, Martin & Bernstein

[57] ABSTRACT

A solder reflow assembly technique wherein a substrate with solder pattern is immersed in a hot bath; after reflow of the solder, elements having a solder pattern therein are individually positioned on the substrate solder pattern; and the elements are aligned on the substrate by the surface tension created by the capillary action of the molten solder.

15 Claims, 7 Drawing Figures

METHOD OF SOLDER REFLOW ASSEMBLY

BACKGROUND OF THE INVENTION

The present invention relates generally to solder reflow assembly techniques of elements or devices to substrates.

The attachment of elements to a substrate, for example a printed circuit board, is generally achieved by the use of solder.

One technique is to insert the leads of the device through the printed circuit board and process the printed circuit board over a wave of solder or dip the ends in a solder bath. The solder adheres to the leads and the boards, and when cooled, secures the leads to the board and electrically connects the leads to the printed circuit portions of the board. Another technique of soldering elements to substrates has included immersion of the substrate and the element in a hot oil bath to cause reflow of the solder which has been preapplied to the elements and the substrate or just the substrate. As the solder is heated in the bath to above its melting point, it reflows forming a single solder connection between the element and the substrate. The elements or substrates are removed and cooled to provide attachment as well as electrical interconnection.

In conventional reflow methods, the parts are positioned on the substrate at a specific location and held in place by a clamping device or fixture. The pre-assembled substrate element is then immersed in the bath for the reflow process. To assure adequate soldering of the elements to the substrate, solder flux paste is placed on the areas where the solder will reflow. The use of the flux leaves a residue which is often hard to remove in a cleaning process and thus is undesirable. Also, the clamping device increases the mass to be heated, thereby extending the heating time or requiring higher temperatures to reduce the heating time, and causes uneven heating of the parts.

The clamping fixture is specifically designed for a given layout and has to be modified for each specific layout of the elements on the board. This requires an increased inventory of clamping fixture for each substrate layout. Because the clamping fixtures securely hold the elements in place once optically aligned, the elements are not allowed to reposition themselves on the circuit board due to the surface tension of the molten solder. Thus by capillar action, the molten solder will move relative to the fixed element and substrate. This produces undesirable solder patterns and configurations.

Reworking of substrates having elements secured thereto is also a problem faced by the prior art. Generally, the substrate with the elements thereon are subjected to a high temperature gas which causes solder reflow. The individual elements are then removed and replaced in a rework sequence. The high temperature gas causes undesirable thermal shock of the substrate and the elements. For hermetically sealed packages, this often results in hermetic failure and reliability problems. Other undesirable effects of the high temperature gas reflow process are: uneven heating, oxidation of the solder, use of excessive heat to reduce heating time because of poor thermal conductivity, lack of surface tension control of the solder during resoldering, and increased cleaning requirements and charring resulting from the use of flux.

SUMMARY OF THE INVENTION

An object of the present invention is to provide a method of solder reflow assembly which prevents thermal shock to the substrate and elements.

Another object of the invention is to provide a solder reflow assembly technique accomplishing uniform heating in an unoxidizing atmosphere.

An even further object of the present invention is to provide a solder reflow technique which allows rework.

A still further object of the present invention is to provide a solder reflow technique without the use of specialized equipment.

A still even further object of the present invention is to provide a solder reflow technique which allows alignment of the elements and the substrate during reflow.

An even further object is to provide a reflow process which minimizes heating time and temperature.

A still further object is to provide a reflow process which forms quality contacts without flux.

Another object is to provide a reflow process which eliminates hermetic failures by eliminating thermal stresses.

These and other objects are accomplished by the method of the present invention which immersing the substrate having solder patterns thereon in a hot oil bath, individually positioning elements having solder thereon adjacent the solder pattern on the substrate and allowing the elements to align themselves relative to the substrate by the surface tension created by the capillary action of the solder. The substrate with the elements thereon are removed from the hot bath and cooled to solidify the molten solder. The substrate is immersed in a generally horizontal position in the hot bath which may include a support for the substrate when positioning elements on the backside of the substrate having vertical backside leads after the positioning of elements on the frontside of the substrate or for a leadless substrate when positioning elements on either side. The rework process also includes immersing the substrate with the attached elements in a hot bath until the solder connection reflows, removing selected elements and positioning substitute elements in their place allowing them to be aligned by surface tension created by capillary action.

Other objects, advantages and novel features of the present invention will become apparent from the following detailed description of the invention when considered in conjunction with the accompanying drawings.

DESCRIPTION OF THE PREFERRED EMBODIMENTS

Figure 1:
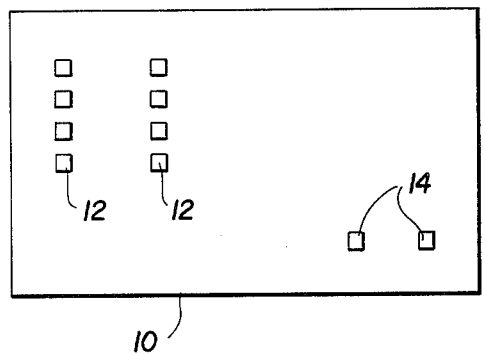
FIG. 1 is a top view of a substrate with solder pads thereon.

A substrate 10, as illustrated in FIG. 1, has a plurality of solder pads 12 and 14 thereon. For sake of clarity, only two groups of solder pads are shown though it is obvious that other solder pads as well as configurations of the substrate may be used. The substrate 10 may be a glass filled substrate such as a printed circuit board or may be a substrate made of ceramic, porcelain coated steel and others used as electrical and electronic circuit panels. The solder pads 12 and 14 are formed of solder for example lead-tin eutectic alloy formed to a thickness of 0.0025 inches, for example. The material of the substrate must be capable of withstanding elevated temperatures of which the solder is melted.

The solder pads 12 and 14 may be formed by any conventional process the following of which is merely an example. The pad pattern is formed by silk screening molybdenum-manganese on the substrate, dry curing and hydrogen firing at 980° C. The pattern is then gold plated, followed by a solder dip sufficient to remove all the gold plate. Nickel plate, solder plate, or tin plate may be substituted for the gold plate followed by solder dipping.

Figure 2:
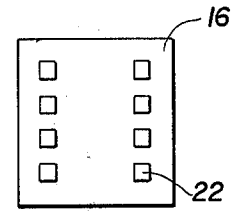
FIG. 2 is a bottom view of a leadless chip carrier with solder pads thereon.
Figures 3, 4:
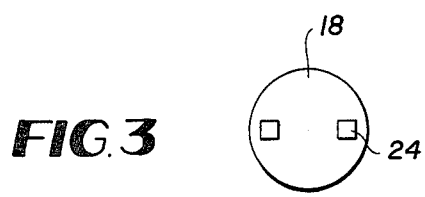
FIG. 3 is bottom view of a chip capacitor with solder pads thereon.
FIG. 4 is a bottom view of a chip resistor with solder pads thereon.

For a typical substrate, the elements, which are attached thereto, generally include leadless hermetic chip carriers 16 illustrated in FIG. 2, chip capacitors 18 illustrated in FIG. 3 and chip resistors 20 illustrated in FIG. 4. The leadless chip carrier 16 includes solder pads 22, the chip capacitor 18 includes solder pads 24 and the chip resistor 20 includes solder pads 26. This is merely an example of the type of elements which are secured to the surface of a substrate, and other types of elements may be used. The bonding pad 22 for the leadless chip carrier 16 are formed by the same process described for the substrate 10. The bonding pads 22 and 26 for the chip capacitor 18 and chip resistor 20 may also be formed by the same process as that for substrate 10 or may be formed by the following alternative process. Silver palladium is silk screened on and oven fired. This is followed directly by solder dipping or by solder plating followed by solder dipping.

Figure 5:
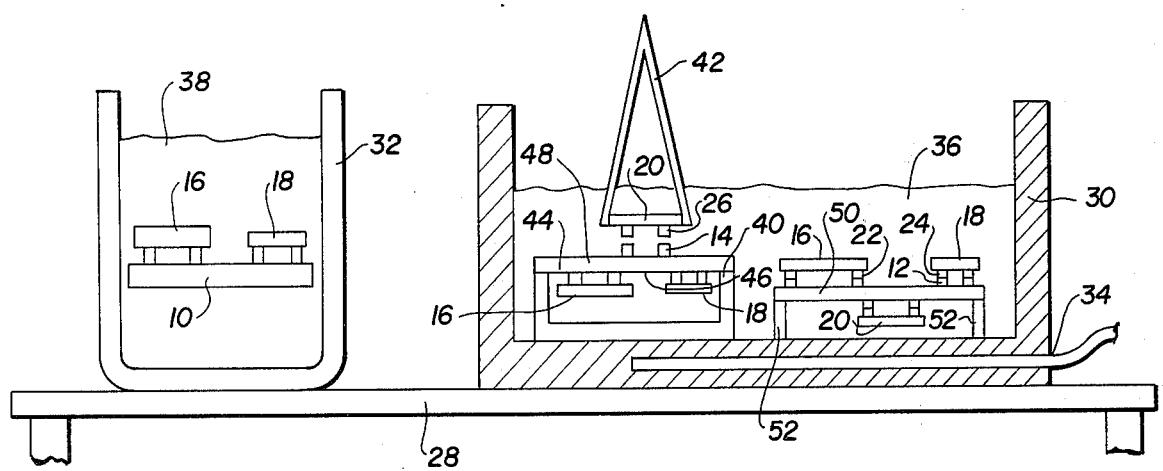
FIG. 5 is a cross-sectional view of a hot and cool liquid bath during the fabrication of the solder reflow technique according to the principles of the present invention.

Equipment need for the present solder reflow assembly process is illustrated in FIG. 5 as including a support structure or table 28 having a liquid heating container 30 and a coolant container 32. The hot bath container 30 includes a schematically represented heater 34. Alternatively, the hot bath container 30 may be a metal pan placed on a separate hot plate. The hot bath is filled with a solder oil, for example Hollis, solder oil #225 or the equivalent. These oils, having a pH of for example 0.6, provide a nonoxidizing environment for the solder. This will reduce the formation of oxidation between the solder of the elements and the substrate and therefore increase the electrical continuity of the solder connection. The oil also modifies the surface tension to prevent balling and allow for the formation of concave solder joints, which reduce bridging. The coolant bath container 32 includes a cooling fluid 38 for example Freon TF or an equivalent coolant fluid which is capable of absorbing the heat of the assembled substrate and elements and helps to remove the reflow oil.

A fixture or support 40 made of, for example, Teflon, is positioned within the hot bath container 30. As will be explained this fixture or support structure is used to support a substrate during the placement and reflow of elements to the front and backside of leadless substrates or only for the placement of elements on the backside of the substrate having vertical lead. The placement of the elements onto the substrates and of the substrates within the baths is performed using a tweezer or equivalent manual device illustrated as 42.

The process begins by filling the containers with their appropriate liquid. The heater 34 of the hot bath container is heated such that the oil 36 reaches a temperature of approximately 10° to 20° C. above the eutectic point of the solder, for example 200° C. plus or minus 5°. This temperature is but an example of the temperature used for this specific solder described above. The Teflon support structure fixture 40 is then inserted into the bath and the temperature of the bath 36 is then again allowed to stabilize. The temperature of the hot oil 36 is monitored by, for example, a thermo couple in the liquid, which is not shown in the drawing, for sake of clarity. A substrate 44 is then placed within the liquid on the support fixture 40 with the top side 46 facing up. Once the solder pads 12 and 14 on the substrate 44 have reflowed or reached to the molten state, individual elements for example chipless lead frame 16 and capacitor 18 are positioned over the respective bond solder pads 12 and 14 of the substrate 44 using tweezers 42. Once the solder pads 22 and 24 on leadless chip carrier 16 and chip capacitor 18, respectively, reflow or reach the molten state, they will attempt to align themselves with the solder pads 12 and 14 of the substrate 44.

Figure 6:
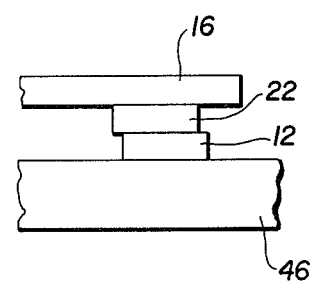
FIG. 6 is an enlarged view of a positioned element on a substrate.
Figure 7:
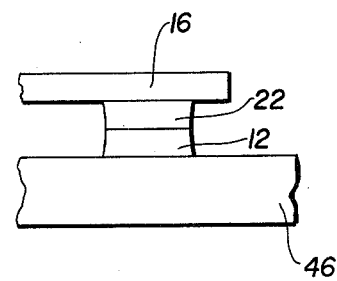
FIG. 7 is an enlarged view of FIG. 6 after alignment according to the principles of the present invention.

As illustrated blow up in FIG. 6, the solder pad 22 of the leadless chip carrier 16 is slightly offset or misaligned relative to the solder pad 12 of the substrate 44. Because of the capillary action of the molten solder 12 and 22, a surface tension exists in the horizontal plane. Since the substrate 44 is substantially stationary, and the element 16 is unclamped and free to move, the surface tension will shift the element 16 to the right as illustrated in FIG. 6 to produce the alignment of FIG. 7. In prior art reflow assembly techniques, the elements, for example 16, are clamped in place on substrate 44 and consequently the surface tension that exists must be dissipated or equalized by a shifting of the solder versus the element 16. This causes the solder to move across the substrate and possibly form undesirable connections or shorts called bridging to the element housing 16 or on the substrate 44. The present invention, by individually positioning elements 16, 18, and 20 on the substrate unclamped, allows the elements to move in response to the surface tension created by the capillary action for more perfect alignment of the solder pads of the substrate and the elements. To facilitate the alignment and equalization of the surface tension, a gentle tap or nudge in the horizontal plane will cause the element to position itself if it is out of position or return to the correct position if it was in such a position before the gentle tap or nudge.

After the elements have aligned themselves, a substrate is lifted gently, since the solder is still in the reflow state, and slowly turned over and placed on the support fixture 40 if bottom side solder contact pads are provided. The substrate 44 as illustrated rests on the support fixture 40 with elements 16 and 18 positioned on a first surface 46 which is the normal top surface and additional contact solder contact pads on the bottom surface 48 which is now facing up. A chip resistor 20 is shown being placed by tweezers 42 on the backside 48 solder pads. The process for placing the elements on the backside is identical to the frontside wherein a gentle tap or nudge will facilitate the alignment due to the surface tension created by the capillary action.

The procedure just described positions elements on the front and then the back side of a leadless substrate 44 while the substrate is positioned on the support fixture 40. Obviously, the elements may be placed on the back surface first if so desired. For a substrate 50 having vertical lead 52 extending therefrom, the substrate can be placed in the oil with the lead 52 contacting the floor of the hot bath container 30 with the top surface facing up. Elements may then be positioned on the top surface. For positioning elements on the bottom surface of the substrate, the substrate 50 is placed on support fixture 40 with the bottom surface up. For vertical lead substrates, it is preferred that the elements, if any, are positioned on the bottom surface first and then the top surface. If the elements were positioned on the top surface first, these elements may be dislodged accidently by knocking against the support fixture 40 when the substrate with the bottom surface up is placed on the support fixture 40.

Once all the elements have been positioned on the substrate, reflow of all the solder has taken place and sufficient time has transpired for alignment, the individual substrates are slowly removed from bath 30 and held thereabove allowing the oil 36 to drip off. After a brief period, for example thirty seconds, the assembled substrate and elements are lowered gently into the coolant bath 38 and the modules are allowed to settle to the bottom. After the assembled substrate and elements have reached approximately room temperature in approximately one to two minutes, the substrates are removed and processed through a cleaning operation.

As can be seen, no specialized equipment is used in the present process. Thus, the expense is minimized while providing repeatable results.

The above process is also applicable to rework elements on a substrate. To perform such a rework process, the substrate with the elements assembled thereto is placed within the hot liquid bath 36 with the top or bottom side up as required such that the element to be reworked is exposed. If the element to replaced is on the bottom side, the substrate is positioned on the Teflon fixture 40. The substrate and assembled elements are then allowed to heat up until the solder connection reflows. This can be checked by tapping on the element to be replaced. If the element moves, the solder is in a molten state. The selected element is grasped with the tweezers 42, gently wiggled and removed from the substrate 44. The replacement element is then positioned on the bonding pads of the substrate. Once the solder of the element becomes molten or reflows, the carrier will align itself with the bonding pads of the substrate due to the surface tension element is generally tapped or nudged to facilitate the alignment.

If elements on both sides of the substrate have to be removed, the ones on the top of the substrate may be removed first and then the substrate is gently turned over and removed from the bottom surface. The removal and replacement steps are then repeated. After all the necessary reworked elements have been replaced, the assembled substrate and elements are removed from the oil and held for approximately thirty seconds and then gently lowered into the cool bath 38 and allowed to settle to the bottom of the container 32. After cooling to room temperature and allowing the solder to solidify, the completed unit is then processed through a clean sequence.

The process for applying elements individually to a substrate wherein the solder pads of the substrate are in a molten state before positioning of the elements on the substrate allows surface tension produced by capillary action to position the element relative to the solder pads on the substrate. The present process not only overcomes the disadvantage of clamping fixtures of the prior art, but also removes the necessity of such fixtures. Similarly by individually introducing the elements into the bath, the temperature of the bath is maintained at a more uniform temperature since there is less mass which must be heated up to the temperature of the bath. Also, the free flow of the hot liquid over the pads on the substrate and the element increases thermal conductivity, and thus reduces the heat up time.

From the preceding description of the preferred embodiments, it is evident that the objects of the invention are attained. Although the invention is described and illustrated in detail, using a specific solder, and cold and hot bath fluids, specific substrates and elements be attached thereto, it is to be clearly understood that the same is by of illustration and example only and is not to be taken by way of limitation. Other materials and elements may be used that fall within the scope of the present invention. The spirit and scope of the present invention are to be limited only by the terms of the appended claims.

What is claimed:

1. A method of attaching and aligning elements on a substrate comprising:
   providing a metallic pattern on a planar surface of a substrate;
   providing a metallic pattern on an element;
   immersing said substrate in a hot liquid bath having a temperature sufficient to melt said metallic pattern;
   after said metallic pattern on said substrate has melted, immersing said element in said bath and positioning said element with its metallic pattern on the metallic pattern of said substrate without traversing said planar surface of said substrate so that the metallic pattern of said substrate and said element are aligned solely by capillary action of said melted metallic patterns; and
   removing said assembled substrate and element from said bath to cool.

2. The method according to claim 1 including individually positioning a plurality of elements on said substrate.

3. The method according to claim 1 wherein said substrate is positioned in said bath in a substantially horizontal position with a first surface facing up, one or more elements are individually positioned on said first surface, said substrate is inverted such that a second surface opposite said first surface is facing up, and one or more elements are positioned individually on said second surface.

4. The method according to claim 3 including providing a substrate support in said hot liquid bath, and positioning a leadless substrate on said support for either surface up.

5. The method according to claim 3, wherein said substrate contains vertical leads extending from said second surface, and further including a substrate support in said hot liquid bath, and wherein said substrate and element positioning steps include:

positioning said vertical leads of said substrate on the floor of said liquid bath with said first surface facing up before positioning one or more elements individually on said first surface;

inverting said substrate and placing said substrate on said substrate support with said second surface of said substrate facing up before positioning one or more elements on said second surface of said substrate.

6. The method according to claim 1 wherein said hot liquid bath is heated at said temperature in the range of 10° to 20° C. above the eutectic temperature of the metallic pattern.

7. The method according to claim 1 wherein said substrate is made of ceramic material and said elements are selected from the group consisting of leadless chip carriers, chip capacitors and chip resistors.

8. The method according to claim 1 including cooling said assembled substrate and element in a cool liquid bath.

9. The method according to claim 8 wherein said cooling liquid bath is Freon.

10. A method of reworking a substrate having a planar surface with a plurality of elements soldered thereto comprising:

immersing said substrate in a hot liquid bath having a temperature sufficient to melt said solder;

removing a selected element from said substrate planar surface after said solder has become molten;

immersing a substitute element in said bath and positioning said substitute element on said immersed substrate planar surface at a location of said removed selected element so that said substitute element is aligned solely by capillary action of said molten solder; and removing said reworked substrate and element from said bath to cool.

11. The method according to claim 10 wherein said substrate is immersed in said bath without hold-down means for said plurality of elements so that any element can be reworked.

12. The method according to claim 10 including cooling said reworked substrate in a liquid bath.

13. The method according to claim 12 wherein said cooling liquid bath is Freon.

14. The method according to claim 10 including providing a substrate support in said hot liquid bath and said substrate is positioned on said support for leadless substrates and substrates having vertical leads.

15. The method according to claim 10 wherein said hot liquid bath is heated at said temperature in the range of 10° to 20° C. above the eutectic temperature of the metallic pattern.

* * * * *